(12) United States Patent
Matsubara et al.

(10) Patent No.: US 7,332,753 B2
(45) Date of Patent: Feb. 19, 2008

(54) SEMICONDUCTOR DEVICE, WAFER AND METHOD OF DESIGNING AND MANUFACTURING THE SAME

(75) Inventors: Yoshihisa Matsubara, Tsukuba (JP); Hiromasa Kobayashi, Tsukuba (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/235,364

(22) Filed: Sep. 27, 2005

(65) Prior Publication Data

US 2006/0071339 A1 Apr. 6, 2006

(30) Foreign Application Priority Data

Sep. 29, 2004 (JP) .............................. 2004-283432

(51) Int. Cl.
*H01L 27/10* (2006.01)
*H01L 29/74* (2006.01)

(52) U.S. Cl. ................. 257/211; 257/202; 257/206; 257/210; 257/758; 257/E23.142; 257/E23.145; 257/E23.151

(58) Field of Classification Search .................... None
See application file for complete search history.

(56) References Cited

U.S. PATENT DOCUMENTS

| | | | |
|---|---|---|---|
| 6,888,254 B2 * | 5/2005 | Yamaguchi et al. | 257/775 |
| 2003/0104690 A1 * | 6/2003 | Matsubara | 438/626 |
| 2003/0148558 A1 * | 8/2003 | Kubo et al. | 438/128 |

* cited by examiner

*Primary Examiner*—Minhloan Tran
*Assistant Examiner*—Leslie Pilar Cruz
(74) *Attorney, Agent, or Firm*—Young & Thompson

(57) ABSTRACT

A process margin of an interconnect is to be expanded, to minimize the impact of vibration generated during a scanning motion of a scanning type exposure equipment. In a semiconductor device, the interconnect handling a greater amount of data (frequently used interconnect) is disposed in a same orientation such that the longitudinal direction of the interconnects is aligned with a scanning direction of a scanning type exposure equipment, in an interconnect layer that includes a narrowest interconnect or a narrowest spacing between the interconnects. Aligning thus the direction of the vibration with the longitudinal direction of the pattern can minimize the positional deviation due to the vibration.

8 Claims, 18 Drawing Sheets

FIG. 10
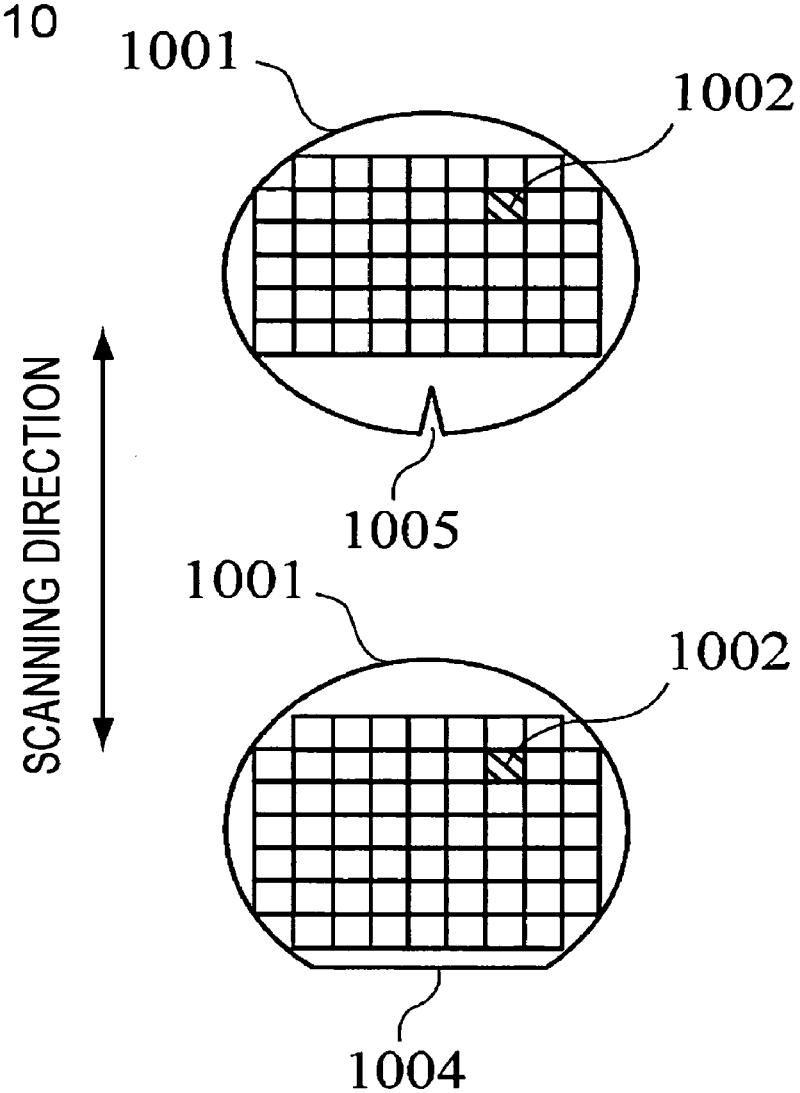
SCANNING DIRECTION
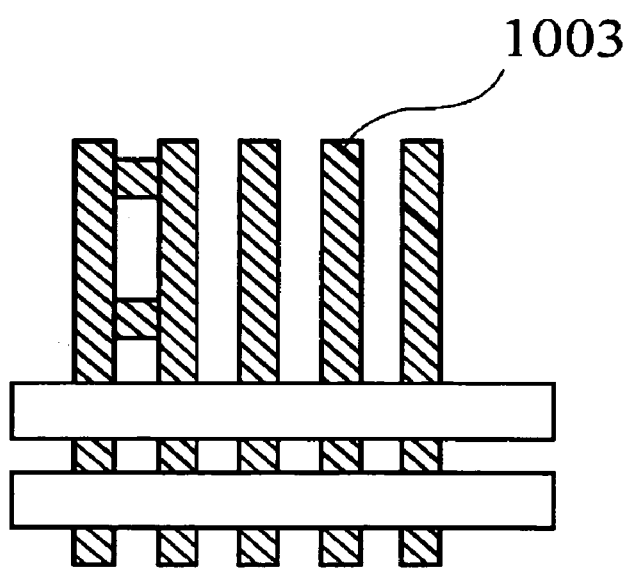

SCANNING DIRECTION

SEMICONDUCTOR DEVICE, WAFER AND METHOD OF DESIGNING AND MANUFACTURING THE SAME

This application is based on Japanese patent application No. 2004-283432, the content of which is incorporated hereinto by reference.

BACKGROUND OF THE INVENTION

1. Field of the Invention

The present invention relates to a semiconductor device, a wafer, and a method of designing and manufacturing the semiconductor device, and more particularly to a semiconductor device including a multilayer interconnect structure of two or more layers, provided with a unique feature in the interconnect layout in the interconnect layer that includes a narrowest interconnect or a narrowest spacing between the interconnects, to a wafer for manufacturing such a semiconductor device, and to a method of designing and manufacturing the semiconductor device.

2. Description of the Related Art

A macroblock in an ASIC (Application Specific Integrated Circuit) includes three functional units, namelyan I/O (Input/Output) unit, a gate array unit and a PLL (Phase Locked Loop). The gate array unit includes a plurality of basic cells, each of which is constituted of a pair of a P-MOS transistor and an N-MOS transistor. Such basic cells are generally called primitive cells. The I/O unit is constituted of a peripheral I/O that transmits and receives standardized signals.

FIG. 11 is a schematic plan view showing a configuration of a popular ASIC device, including a layout of the macroblock.

The device includes an I/O block 1101 disposed serving as an input/output interface, in a peripheral region. In inner regions of the device, primitive blocks 1102, 1103 are disposed, and the primitive block 1103 includes a SRAM 1104 serving as a memory. Most of the current devices are provided with the SRAM 1104 that includes two stages of a high-speed SRAM and a high-density SRAM.

In the primitive block, a multilayer interconnect structure including two or more layers is employed for interconnection of the primitive cells. The multilayer interconnection in the ASIC device will be described hereunder, referring to some drawings.

FIG. 12 is an enlarged plan view showing a region 1105 in the primitive block 1102 of the ASIC device shown in FIG. 11. FIG. 12 only depicts the primitive cell, a second metal interconnect layer (hereinafter, interconnect layer M2) and a third metal interconnect layer (hereinafter, interconnect layer M3), omitting the remaining interconnect layers.

The size of the primitive cell 1203 constituted of the P-MOS transistor 1201 and the N-MOS transistor 1202, called as a cell height 1204, is an important factor in each device. The cell height 1204 is a fundamental unit that should be optimally designed, as the cell height 1204 determines the driving capability of the transistors. The cell height 1204 is determined by multiplying the basic size of the transistor by an integer, or dividing an I/O macro width 1205, which is approx. 50 nm, by an integer.

The interconnect layer M2 includes a power supply line 1206 and a signal line 1207, and the interconnect layer M3 includes a power supply line 1208 and a signal line 1209. The interconnect lines in the primitive block mainly include a power supply line, a clock tree system timing interconnect, a signal transmitting interconnect, and a local interconnect serving for functional devices, which are the dominant factors that determine the efficiency of the layout.

FIG. 13 is an enlarged fragmentary view of the primitive cell 1203 shown in FIG. 12. FIG. 13 only depicts the primitive cell 1203, a first metal interconnect layer (hereinafter, interconnect layer M1) and the interconnect layer M2, omitting the remaining interconnect layers. In the primitive cell 1203, a VDD 1301 and a VSS 1302, which are the power supply line of the interconnect layer M2, are disposed across the P-MOS transistor 1201 and the N-MOS transistor 1202 respectively. To the power supply mesh of the interconnect layer M2, a first metal interconnect (hereinafter, M1 interconnect) 1303 is connected through a via 1304. The M1 interconnect includes finely divided power supply lines, and is generally called the local interconnect.

FIG. 14 is a schematic diagram showing a configuration of a dual-stage inverter including the primitive cell. FIG. 14 only depicts a diffusion layer 1403 including a P-MOS transistor 1401 and an N-MOS transistor 1402, agate electrode 1404 and the M1 interconnect 1406, omitting the remaining interconnect layers.

The gate electrode 1404 serves as an interconnect, in addition to working as the gate electrode for the P-MOS transistor 1401 and the N-MOS transistor 1402. The diffusion layer 1403 receives a power from the VDD or VSS, via a local interconnect of the M1 interconnect 1406 and a contact 1405.

The foregoing is the outline of the multilayer interconnect structure in the ASIC device, shown in FIGS. 12 to 14. The following passages cover a method of manufacturing the ASIC device including the tri-level interconnect layers constructed as above.

FIGS. 15A to 15F are schematic cross-sectional views for explaining a manufacturing method of the ASIC device including tri-level interconnect layers.

Referring first to FIG. 15A, an N-type source region 1502 and an N-type source drain region 1503, a gate insulating layer 1504 and a gate electrode 1505 are formed on a P-type silicon substrate 1501 by a known photolithography and ion implantation process, and a CVD (Chemical Vapor Deposition) process is performed to form a first interlayer dielectric 1506 constituted of a silicon oxide layer, all over the substrate. A plurality of MOS transistors thus formed is routed through the subsequent steps.

Referring to FIG. 15B, a via is formed in the first interlayer dielectric 1506 by photolithography, after which the via is filled with tungsten (W) to thus form a plug conductor 1507.

Proceeding to FIG. 15C, an insulating layer 1508 constituted of a silicon oxide layer by CVD, and then an interconnect trench 1509 is formed in a predetermined pattern by photolithography, at a desired position on the insulating layer 1508.

Referring then to FIG. 15D, a conductor layer 1510 constituted of copper (Du) or aluminum (Al) is formed by CVD all over the insulating layer 1508 including the interconnect trench 1509.

At FIG. 15E, a CMP (Chemical Mechanical Polishing) process is performed for planarizing the surface of the second interlayer dielectric 1508. Upon completing the CMP process, the M1 interconnect of a Damascene structure is obtained in a strap shape at the desired position on the second interlayer dielectric 1508.

The above is followed by repetitions of similar steps to those corresponding to FIGS. 15A to 15E, to achieve a structure shown in FIG. 15F. Specifically, a second interlayer dielectric 1512, an interconnect layer M2 1513, a third interlayer dielectric 1514, an interconnect layer M3 1515, and a fourth interlayer dielectric 1516 are formed on the interconnect layer M1 1511. The fourth interlayer dielectric 1516 serves to protect the MOS transistor from the ambient atmosphere. Finally an electrode 1517 is formed, to thereby complete the fabrication of the semiconductor device including the tri-level interconnect layers.

The following passages describe the photolithography process employed in the foregoing method of manufacturing.

The exposure technique for semiconductor devices has been innovated along with the micronization of the devices, as stated in the non-patented documents 1 and 2. The exposure method has also been shifted from a "step & repeat" method of repeating reduction projection of a reticle on different positions on a wafer, to a scanning method of causing the reticle and the wafer to relatively move for the exposure. This is because the stepper type exposure equipments are no longer capable of satisfying severe requirements originating from the ongoing micronization of the circuit pattern of the devices. Instead, the development of the scanning type exposure equipments has enabled satisfying required precision in dimensions and overlay when exposing a pattern of 100 nm or less in size, in addition to a shorter wavelength of a light source and higher numerical apertures.

FIG. 16 is a schematic side view showing a popular scanning type exposure equipment.

An ArF (argon fluoride) beam of 1.725 nm in wavelength irradiated by a light source 1601 is projected on a wafer 1603 through a reticle 1602. The pattern delineated on the reticle is reduced to a quarter in dimensions by two lens systems 1604, 1605. A reticle scanning stage 1606 and a wafer scanning stage 1607 are synchronically scanned, and a relative positional deviation is controlled. In the stepper-type exposure equipment the stage is immobile during the exposure since the entire pattern is exposed by turns. In contrast, in the scanning type exposure equipment the pattern is exposed real time, while the stage is being moved for scanning.

FIGS. 17A and 17B are schematic plan views showing a positional relation between a lens and an exposure region, in the stepper-type exposure equipment and the scanning type exposure equipment.

As shown in FIG. 17A, the exposure region 1702 is enclosed in the lens 1701, so that a major portion of the lens 1701 is utilized for the exposure, in the stepping equipment. In contrast, in the scanning equipment shown in FIG. 17B, a slot 1704 is provided at an appropriate position of the lens 1703, so as to utilize such portion for scanning to cover the exposure region 1705. This method allows utilizing only a portion of the lens where aberration is minimal for the exposure, thus providing an excellent exposure characteristic.

[Non-patented document 1] Tatsuhiko HIGASHIKI, "Photolithography: Practical Fundamentals and Challenges", ED Research Co., Ltd., Jul. 1, 2002

[Non-patented document 2] Tatsuhiko HIGASHIKI, "Photolithography II: Measurement and Control", ED Research Co., Ltd., Jun. 10, 2003

As described above, the scanning type exposure equipment is now indispensable for satisfying a fine interconnect spec, because of its higher exposure characteristic.

However, the scanning type exposure equipment is not free from drawbacks, such as being susceptible to vibration during the movement for the scanning, since the exposure is performed parallel to the scanning. A precision under such a state is referred to as "synchronization accuracy". The synchronization accuracy is determined by an average (MEAN) value of a relative travel distance of the slot on the reticle with respect to the wafer, and a MSD (Moving Standard Deviation) of the travel distance.

FIG. 18 is a schematic diagram showing a positional deviation created by the relative movement of the reticle.

For the purpose of the description, the slot 1801 on the reticle is assumed to move to a position 1802 during the scanning. The position where the slot actually reaches may be deviated as a position 1803 or a position 1804, because of vibration or other reasons. The travel distances in such cases (1805, 1806) include a deviation 1808, 1809 respectively, with respect to the average distance 1807. The fluctuation of the deviation is represented by the MSD of the travel distance. The more the average of the travel distance deviates from the standard value, the lower the pattern overlay accuracy becomes, and when the MSD of the travel distance becomes greater, the contrast in the image becomes lower. Such problem with the synchronization accuracy originating from vibration is unique to the scanning type exposure equipment, not observed with respect to the stepping type exposure equipment.

For improving the synchronization accuracy, restraining the vibration is one of the measures to be taken. The vibration includes not only an external vibration generated by a factor outside the equipment, but also a vibration generated by the scanning motion as already mentioned. For restraining the vibration generated by the scanning motion, heavy restriction should be imposed on the specifications of the equipment, since the issue relates to manufacturing interconnects of a scale level of 100 nm. In short, the expected throughput of the equipment and the synchronization accuracy are trade-off factors.

Also, a microlithography for forming interconnects in a scale level of 100 nm incurs a phenomenon that a dimensional fluctuation of the mask pattern on the reticle becomes non-linear with respect to an exposure pattern fluctuation. This is called a MEEF (Mask Error Enhancement Factor) between the mask dimensional fluctuation and the wafer dimensional fluctuation. As shown in FIG. 17B, the exposure light only passes a portion of the lens, in the scanning equipment. This leads to a partially coherent exposure, so that in the limit of resolution the contrast in the pattern image formed on the wafer is degraded. Between the MEEF and them ask pattern, a general tendency can be seen that a progress in micronization leads to an increase in MEEF, which in turn increases the dimensional fluctuation of the resist pattern.

In the scanning type exposure equipment of a reduction ratio of ¼, the pattern on the reticle is reduced to ¼ in dimensions when transferred onto the wafer. When the MEEF is 1, the dimensional fluctuation of 10 nm on the reticle is reduced to 2.5 nm on the wafer. On the other hand, when the MEEF is 5, the fluctuation is enlarged to as much as 12.5 nm.

As described above, the error resultant from focus fluctuation based on the MEEF imposes a significant difficulty in establishing a size budget in the microlithography of a scale level of 100 nm. This makes the issue of the synchronization accuracy more complicated, thereby enhancing the importance of upgrading the synchronization accuracy.

SUMMARY OF THE INVENTION

The present invention has been conceived in view of the foregoing problems, with an object to provide a semiconductor device and a wafer made resistant against the vibration generated during the scanning motion so as to minimize the dimensional fluctuation, and a method of designing and manufacturing such a semiconductor device.

In the semiconductor device, it is preferable to dispose an interconnect handling a greater amount of data (frequently used interconnect) in a same orientation such that the longitudinal direction of the interconnects is aligned with a scanning direction of a scanning type exposure equipment, in an interconnect layer that includes a narrowest interconnect or a narrowest spacing between interconnects. This also applies to each semiconductor device in a wafer including a plurality of semiconductor devices.

Accordingly, there is provided a semiconductor device comprising:

a plurality of chips provided on a semiconductor substrate;

a plurality of interconnect layers respectively provided on the chips via an insulating layer;

wherein a longitudinal direction of a frequently used interconnect, in an interconnect layer that includes a narrowest interconnect or a narrowest spacing between interconnects among the plurality of interconnects layers, is aligned with a scanning direction for a wafer stage of an exposure equipment to be employed for fabricating the semiconductor device.

Here, in the case where the finished semiconductor device is to include rectangular chips (dies), the scanning direction for the wafer stage of the exposure equipment to be employed for fabricating the semiconductor device is normally parallel to the longitudinal sides of the chips.

The present invention also provides a semiconductor device, comprising:

a plurality of chips provided on a semiconductor substrate;

first interconnect layers respectively provided on the chips via an insulating layer so as to connect the chips; second interconnect layers respectively provided on the first interconnect layers via an insulating layer so as to connect the first interconnect layers; and third interconnect layers respectively provided on the second interconnect layers via an insulating layer so as to connect the second interconnect layers;

wherein a longitudinal direction of a frequently used interconnect in the first interconnect layers is aligned with a scanning direction for a wafer stage of an exposure equipment to be employed for fabricating the semiconductor device.

The present invention also provides a semiconductor device, comprising an I/O unit that exchanges signals with an external device, and a logic unit that processes the signals, the logic unit including two or more logic blocks in which a plurality of basic cells constituted of a pair of a P-MOS transistor and an N-MOS transistor is regularly aligned, such that the basic cells are of a uniform size in the respective logic blocks;

wherein, in a first interconnect layer that includes a narrowest interconnect or a narrowest spacing between interconnects among the plurality of interconnect layers connecting the basic cells in at least one of the logic blocks, a longitudinal direction of a frequently used interconnect is aligned with a scanning direction for a wafer stage of an exposure equipment to be employed for fabricating the semiconductor device.

The present invention also provides the semiconductor device according to the foregoing, wherein, in the logic block in which a diffusion layer for the P-MOS transistor or the N-MOS transistor constituting the basic cells is shorter than a spacing between power supply lines or between reference potential interconnects in a second interconnect layer provided on a first interconnect layer via an insulating layer, a longitudinal direction of a frequently used interconnect is aligned with a longitudinal direction of the diffusion layer for the transistors.

The present invention also provides the semiconductor device according to the foregoing, wherein, in the logic block in which the diffusion layer for the transistors constituting the basic cells is longer than the spacing between power supply lines or between reference potential interconnects in the second interconnect layer provided on the first interconnect layer via the insulating layer, the longitudinal direction of the frequently used interconnect is orthogonal to the longitudinal direction of the diffusion layer for the transistors.

Further, the present invention provides the semiconductor device according to the foregoing, wherein a width of the interconnect or a spacing between the interconnects orthogonal to the frequently used interconnect in the first interconnect layer is wider than a width of the frequently used interconnect or a spacing between the frequently used interconnects.

Further, the present invention provides the semiconductor device according to the foregoing, wherein a minimum width of the frequently used interconnect is not wider than 0.15 μm.

Further, the present invention provides the semiconductor device according to the foregoing, wherein a minimum spacing between the frequently used interconnects is not wider than 0.15 μm.

Still further, the present invention provides the semiconductor device according to the foregoing, wherein a minimum spacing between the frequently used interconnects is not more than 0.3 μm.

According to another aspect of the present invention, there is provided a wafer that has a cutaway portion or an orientation flat along a circular circumferential edge, wherein in an interconnect layer that includes a narrowest interconnect or a narrowest spacing between interconnects among interconnect layers in a plurality of semiconductor devices provided on the wafer, a longitudinal direction of a frequently used interconnect is orthogonal to a tangential line along which the cutaway portion or the orientation flat is disposed.

According to still another aspect of the present invention, there is provided a method of designing a semiconductor device including a plurality of circuit blocks in which a plurality of P-MOS transistors and N-MOS transistors is alternately disposed, comprising, in a first interconnect layer that includes a narrowest interconnect or a narrowest spacing between interconnects among interconnect layers connecting the P-MOS transistors and N-MOS transistors in at least one of the circuit blocks, setting a longitudinal direction of a frequently used interconnect to be aligned with a scanning direction for a wafer stage of an exposure equipment to be employed for fabricating the semiconductor device.

The present invention also provides the method of designing a semiconductor device according to the foregoing, comprising setting a width of the interconnect or a spacing between the interconnects orthogonal to the frequently used interconnect to be wider than a width of the frequently used interconnect or a spacing between the frequently used interconnects, in the first interconnect layer.

According to another aspect of the present invention, there is provided a method of designing a semiconductor device including a plurality of circuit blocks in which a plurality of P-MOS transistors and N-MOS transistors is alternately disposed, and a plurality of interconnect layers connecting the P-MOS transistors and the N-MOS transistors, comprising:

comparing a designed height of a primitive cell constituted of the P-MOS transistor and the N-MOS transistor with a spacing among the power supply mesh in a second interconnect layer constituting a second layer from a substrate among the plurality of interconnect layers;

disposing the primitive cell that has a higher designed height than the spacing among the power supply mesh such that the height direction of the primitive cell is aligned with a scanning direction for a wafer stage of an exposure equipment to be employed for fabricating the semiconductor device; and disposing the primitive cell that has a lower designed height than the spacing among the power supply mesh such that the height direction of the primitive cell becomes orthogonal to the scanning direction.

According to another aspect of the present invention, there is provided a method of manufacturing a semiconductor device including a plurality of circuit blocks in which a plurality of P-MOS transistors and N-MOS transistors is alternately disposed, and a plurality of interconnect layers connecting the P-MOS transistors and the N-MOS transistors, comprising:

performing an exposure, with a primitive cell constituted of the P-MOS transistor and the N-MOS transistor disposed such that the height direction of the primitive cell is aligned with a scanning direction for a wafer stage of an exposure equipment to be employed for fabricating the semiconductor device, in the case where the primitive cell is higher than a spacing among a power supply mesh in a second interconnect layer constituting a second layer from a substrate among the plurality of interconnect layers, in at least one of the circuit blocks.

According to another aspect of the present invention, there is provided a method of manufacturing a semiconductor device including a plurality of circuit blocks in which a plurality of P-MOS transistors and N-MOS transistors is alternately disposed, and a plurality of interconnect layers connecting the P-MOS transistors and the N-MOS transistors, comprising:

performing an exposure, with a primitive cell constituted of the P-MOS transistor and the N-MOS transistor disposed such that the height direction of the primitive cell becomes orthogonal to a scanning direction for a wafer stage of an exposure equipment to be employed for fabricating the semiconductor device, in the case where the primitive cell is lower than a spacing among a power supply mesh in a second interconnect layer constituting a second layer from a substrate among the plurality of interconnect layers, in at least one of the circuit blocks.

According to the present invention, a longitudinal direction of an interconnect handling a greater amount of data (frequently used interconnect) can be aligned with a scanning direction of the scanning type exposure equipment, in an interconnect layer that includes a narrowest interconnect or a narrowest spacing between interconnects, in a semiconductor device including a multilayer interconnect structure. Such arrangement aligns a direction of vibration with the longitudinal direction of the pattern, thereby minimizing deviation of the pattern caused by the vibration. The interconnects handling a greater amount of data generally have a larger aspect ratio of the pattern, and therefore reducing thus the MEAN and the MSD values in the longitudinal direction of the interconnect, along which a margin between adjacent patterns is more difficult to secure, facilitates securing a larger process margin.

BRIEF DESCRIPTION OF THE DRAWINGS

The above and other objects, advantages and features of the present invention will be more apparent from the following description taken in conjunction with the accompanying drawings, in which:

FIG. 10 includes schematic drawings showing a relation between a wafer on which the semiconductor device is provided and a scanning direction;

DETAILED DESCRIPTION OF THE INVENTION

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

The present inventors have made a close investigation on the relation between an interconnect and vibration, in other words between the interconnect and a scanning direction, for expanding a process margin for a scanning type exposure equipment.

Figure 1A:
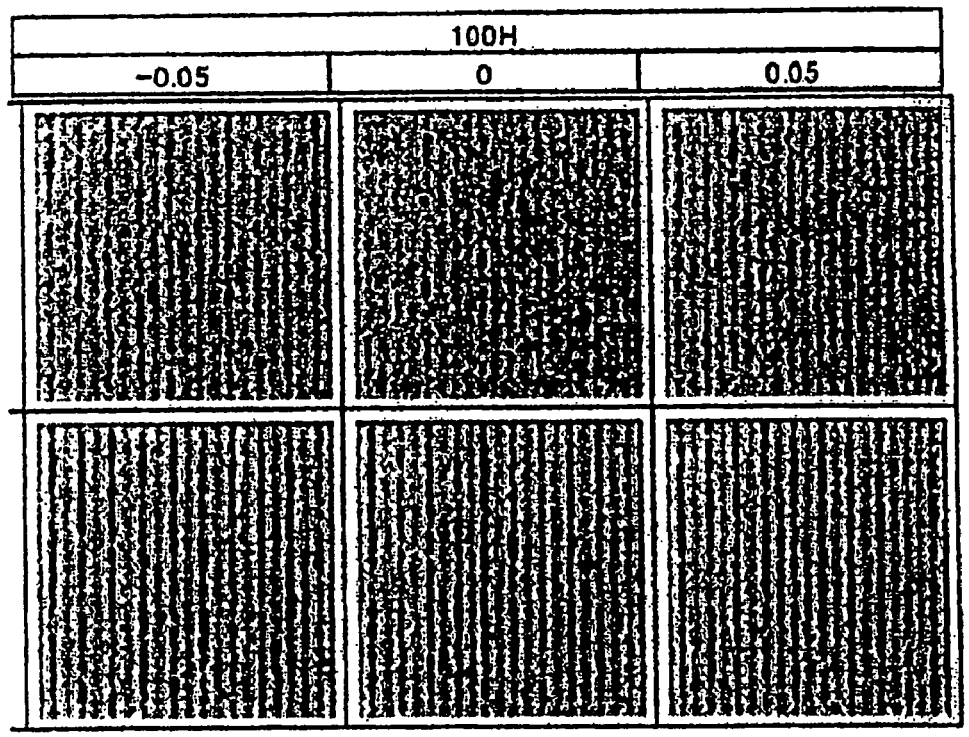
FIGS. 1A and 1B are photos of interconnects taken after scanning exposures under different MSD values.
Figure 1B:
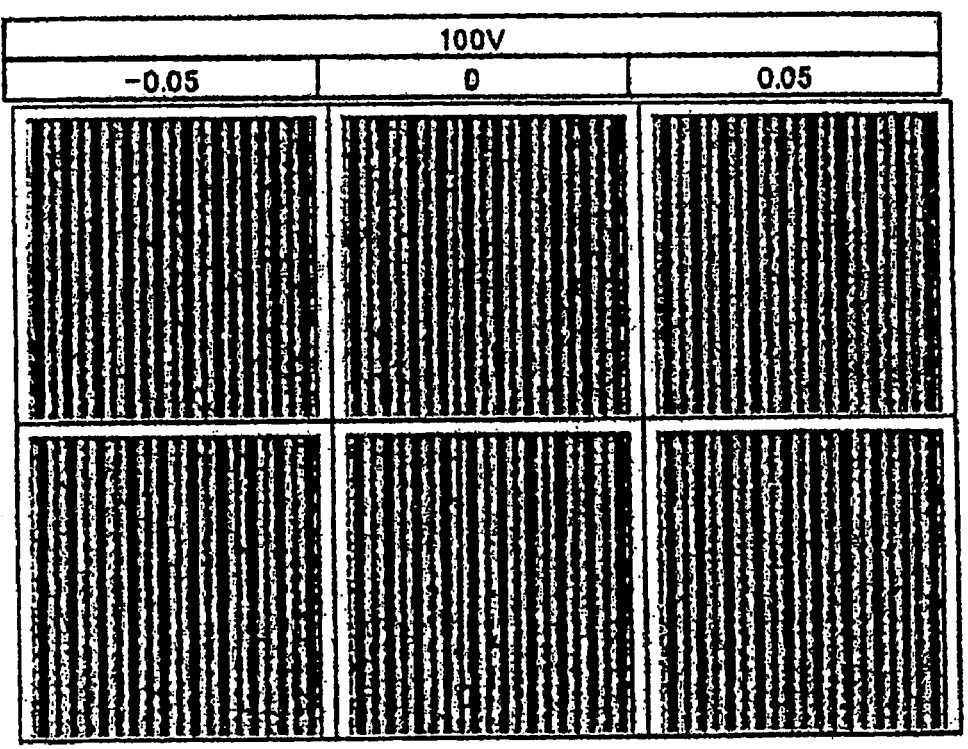

FIGS. 1A and 1B are photos of interconnects taken after scanning exposures under different MSD values. FIG. 1B includes the photos representing the interconnects with the longitudinal direction aligned with the scanning direction (hereinafter, a longitudinal interconnect), while FIG. 1A includes the photos representing the interconnects with the longitudinal direction set orthogonal to the scanning direction (hereinafter, a transverse interconnect). The MSD values are set at 20 for the upper columns and 15 for the lower columns respectively. The transverse interconnects shown in FIG. 1A generally have a lower contrast value of the pattern, which becomes more prominent by increasing the MSD value from 15 to 20. On the other hand, the longitudinal interconnects shown in FIG. 1B have higher contrast values than the transverse interconnects, and the pattern shapes look substantially the same despite increasing the MSD value from 15 to 20.

A reason of such phenomenon is given below, referring to the associated drawings.

Figure 2A:
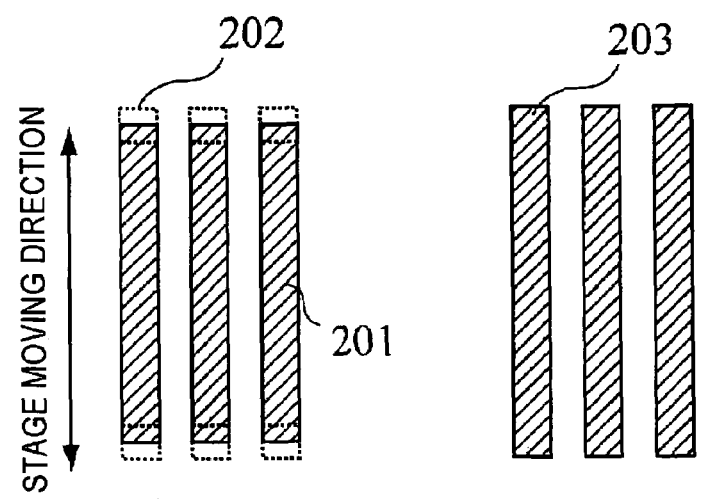
FIGS. 2A and 2B are schematic drawings for explaining a relation between a reticle scanning direction and a resist shape.
Figure 2B:
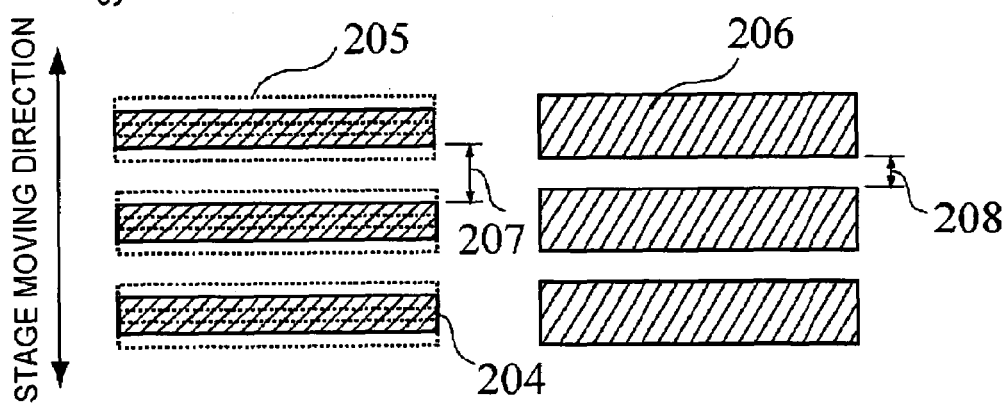

FIGS. 2A and 2B are schematic drawings for explaining a relation between a reticle scanning direction and a resist shape. The scanning direction herein referred to designates the direction in which the stage is moved.

FIG. 2A depicts the shape of a slot for the longitudinal interconnect and of a resist. The travel of the slot 201 provided on the reticle incurs a deviation 202 determined by the MEAN value and MSD according to the vibration in the moving direction. The resist 203 exposed under such a state presents a profile extended in the direction of the vibration, from the designed dimension.

FIG. 2B depicts the shape of a slot for the transverse interconnect and of a resist. The travel of the slot 204 provided on the reticle incurs a deviation 205 determined by the MEAN value and MSD according to the vibration in the moving direction. The resist 206 exposed under such a state presents a profile extended in the direction of the vibration, from the designed dimension.

Figure 13:
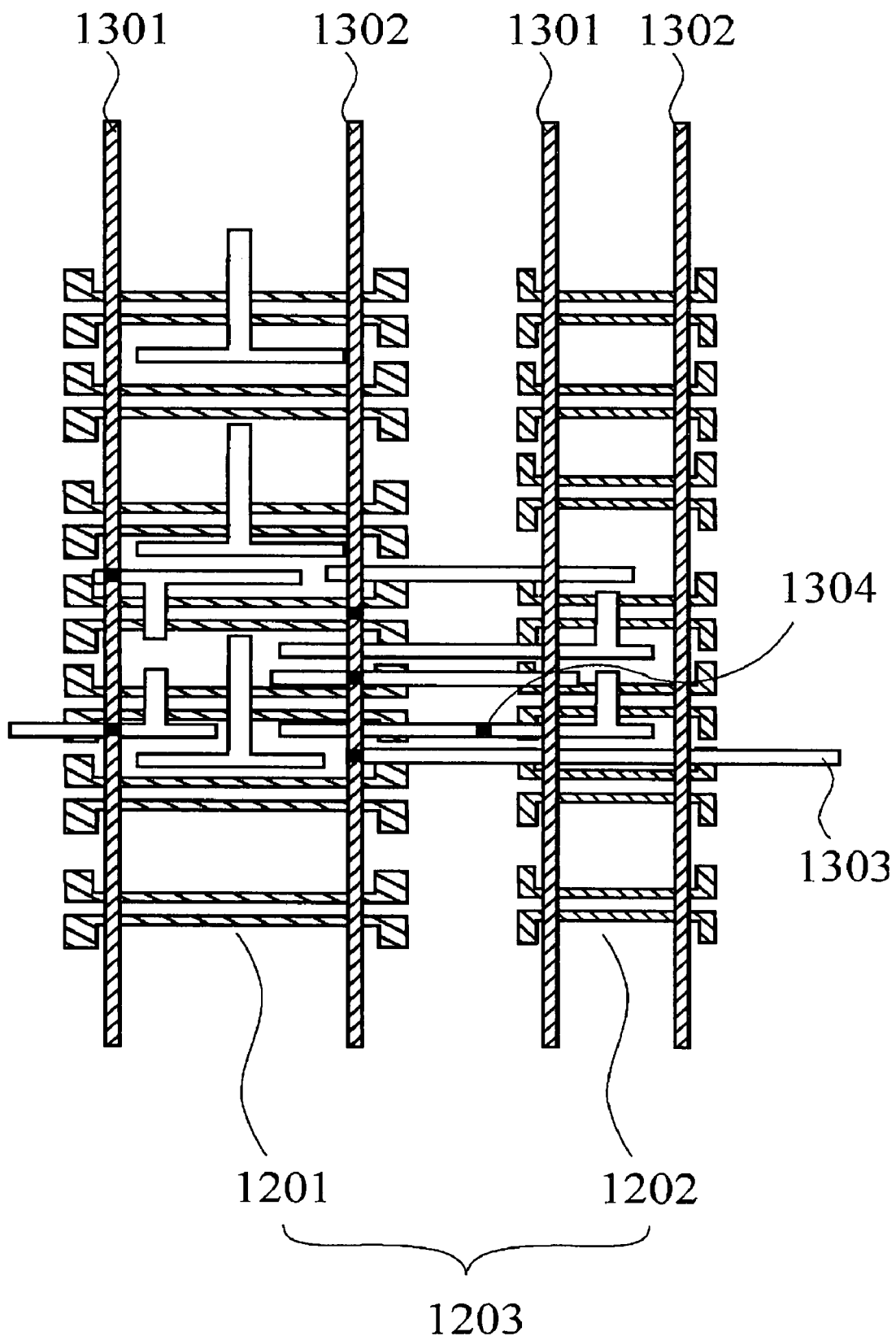
FIG. 13 is an enlarged fragmentary view of the primitive cell 1203 shown in FIG. 12.
Figure 14:
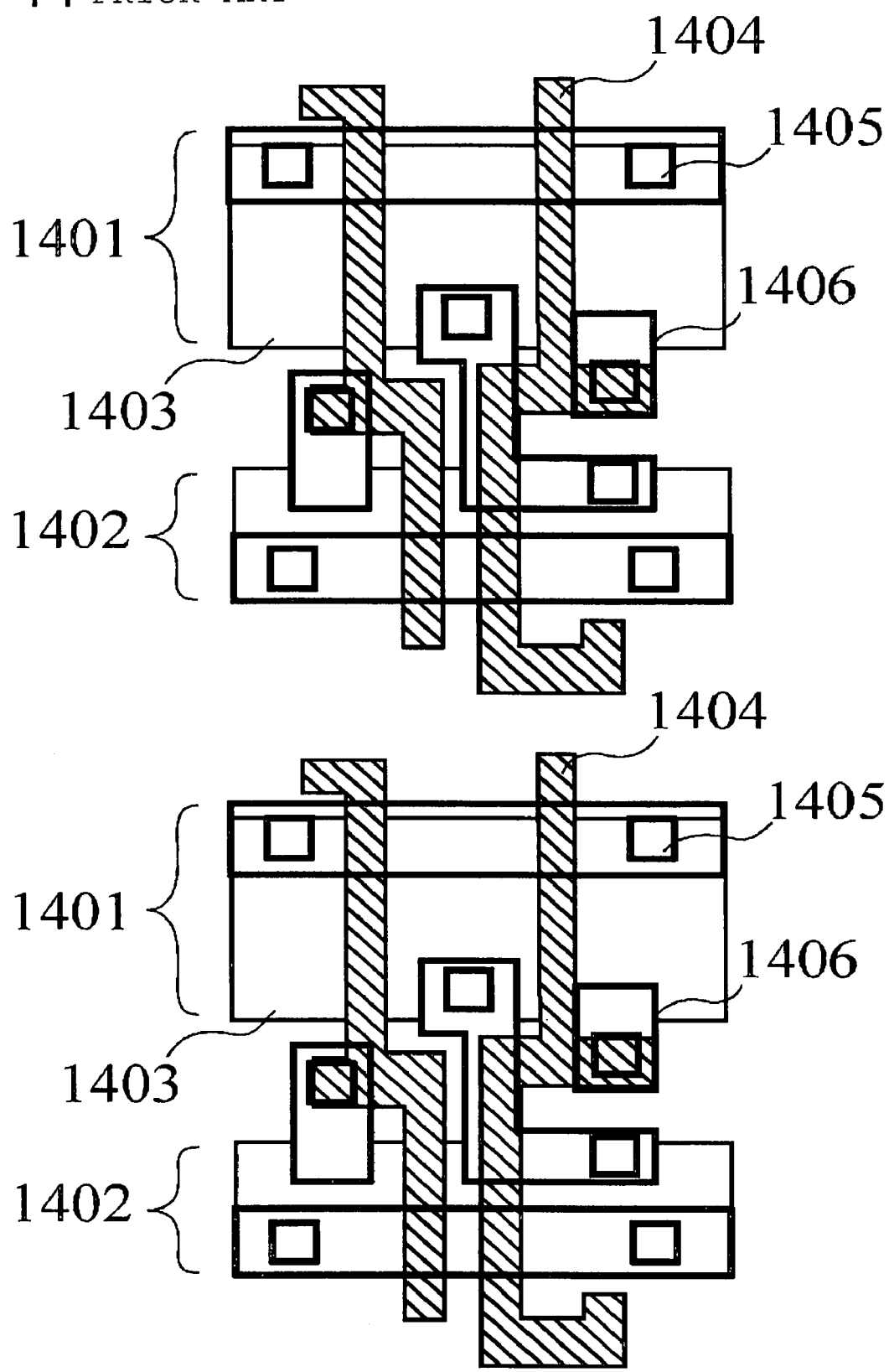
FIG. 14 is a schematic diagram showing a configuration of a dual-stage inverter including the primitive cell.
Figure 15:
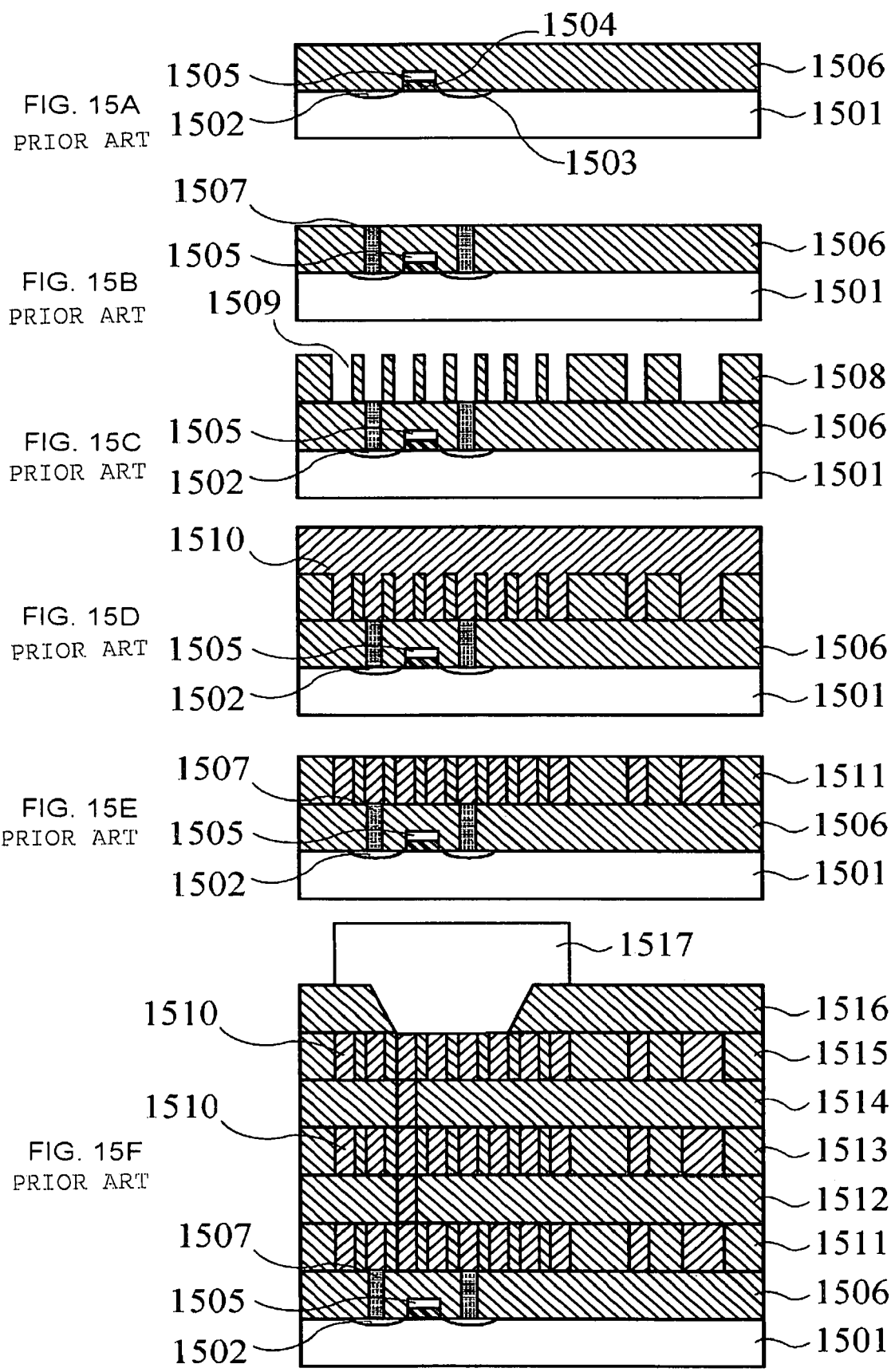
FIGS. 15A to 15F are schematic cross-sectional views for explaining a manufacturing method of the ASIC device including tri-level interconnect layers.
Figure 16:
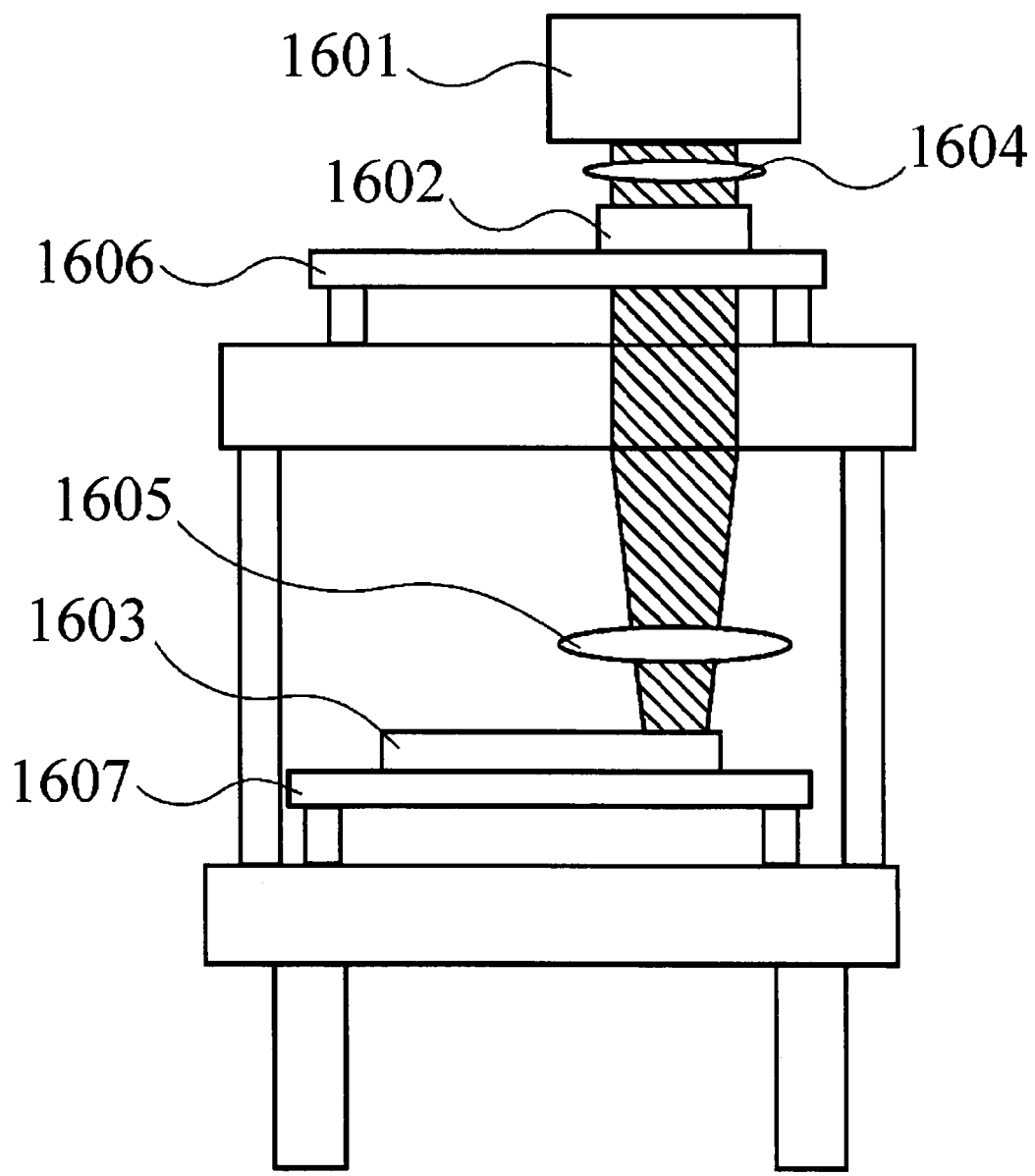
FIG. 16 is a schematic side view showing a popular scanning type exposure equipment.
Figure 17A:
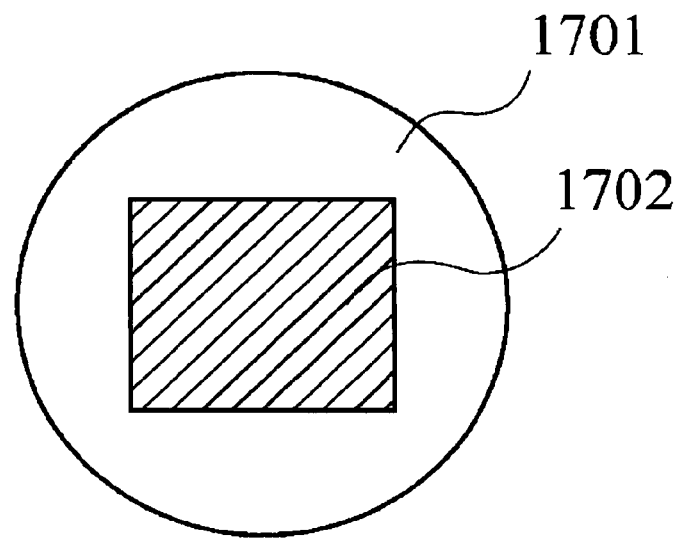
FIGS. 17A and 17B are schematic plan views showing a positional relation between a lens and an exposure region, in the stepper-type exposure equipment and the scanning type exposure equipment.
Figure 17B:
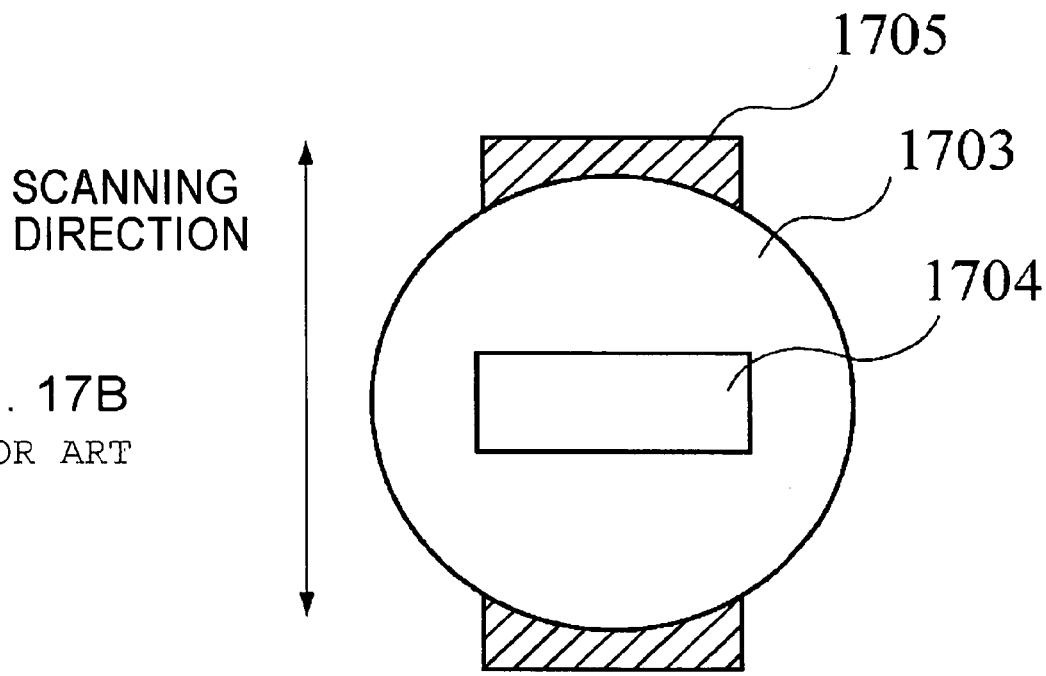
Figure 18:
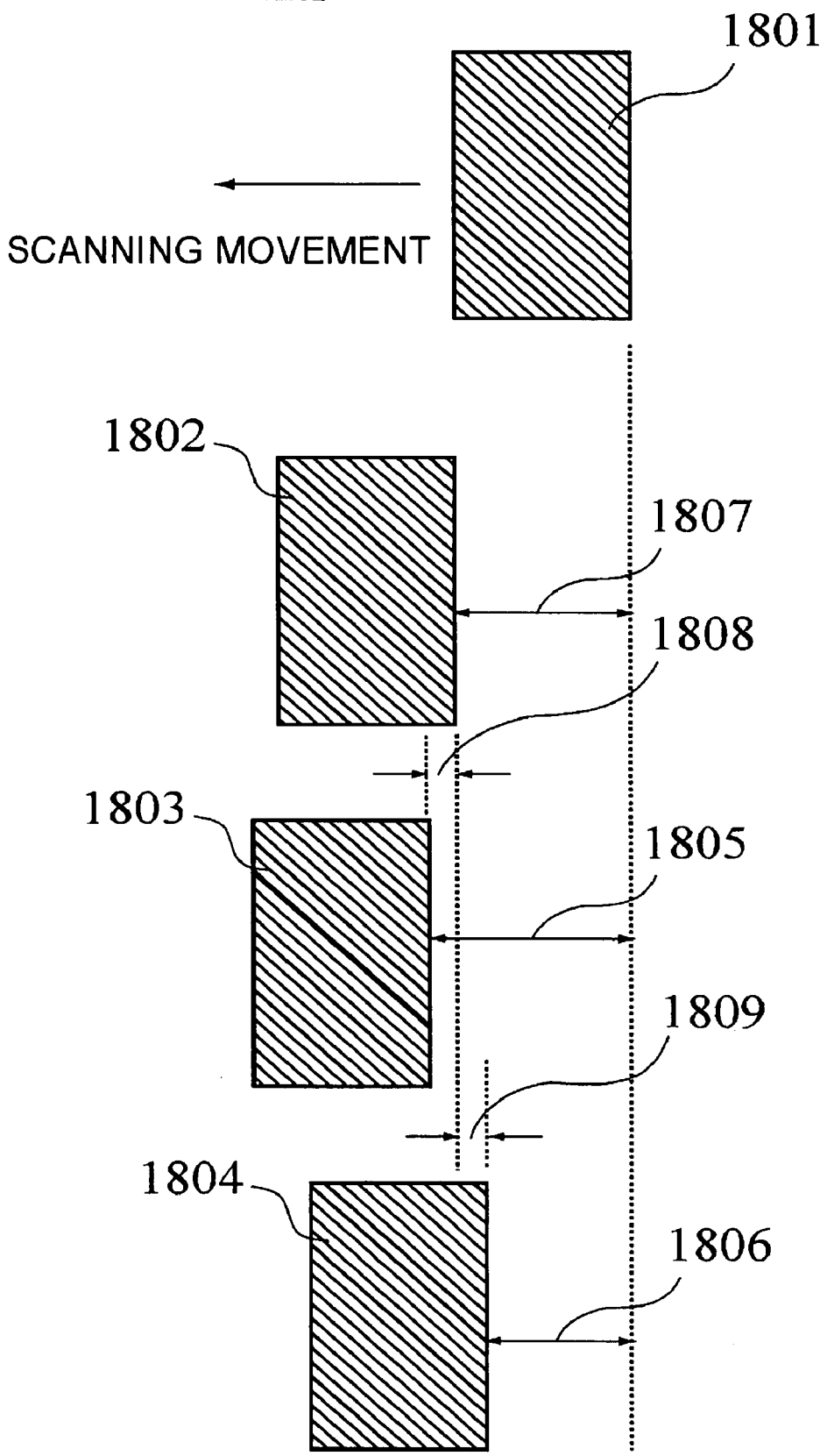
FIG. 18 is a schematic diagram showing a positional deviation created by the relative movement of the reticle.

As is apparent from the comparison of FIGS. 2A and 2B, the transverse interconnect presents a larger variation of the pattern profile, despite being formed under the same synchronization accuracy. Besides, the increase in the pattern width reduces the original spacing 207 between the interconnects on the reticle to the spacing 208 between the interconnects on the wafer, thus failing to secure a sufficient spacing between the interconnects. When such phenomenon takes place for example in the interconnect layer M1 shown in FIG. 13, the insufficient spacing between the interconnects may provoke a short circuit therebetween, to thereby produce a defective device.

Upon recognizing such relation between the longitudinal direction of the interconnects and the scanning direction, the present inventors have reviewed the orientation of the interconnects which have not been specifically defined so far, to incorporate such a viewpoint in the designing of the interconnects for the ASIC device.

Figure 11:
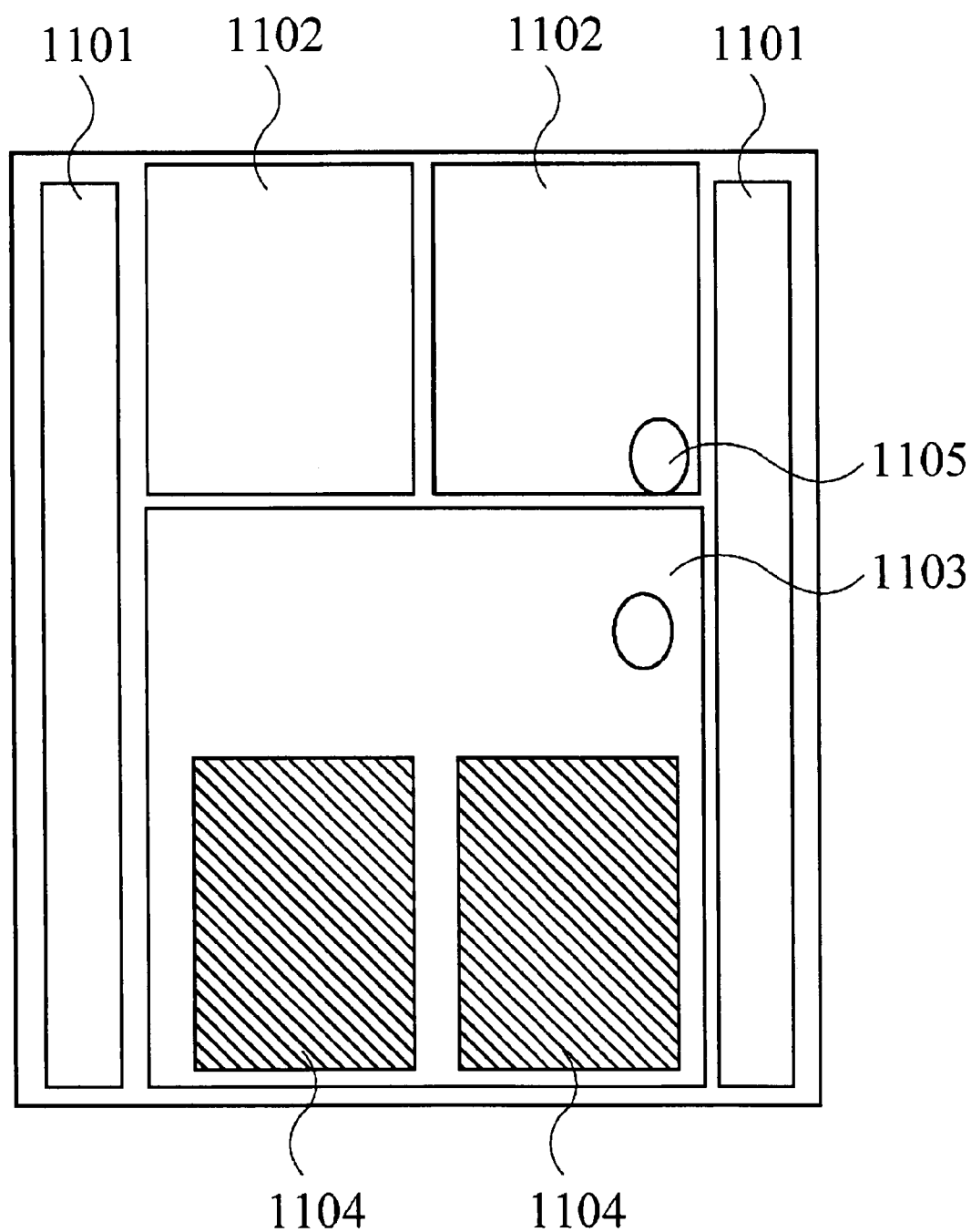
FIG. 11 is a schematic plan view showing a configuration of a popular ASIC device.
Figure 12:
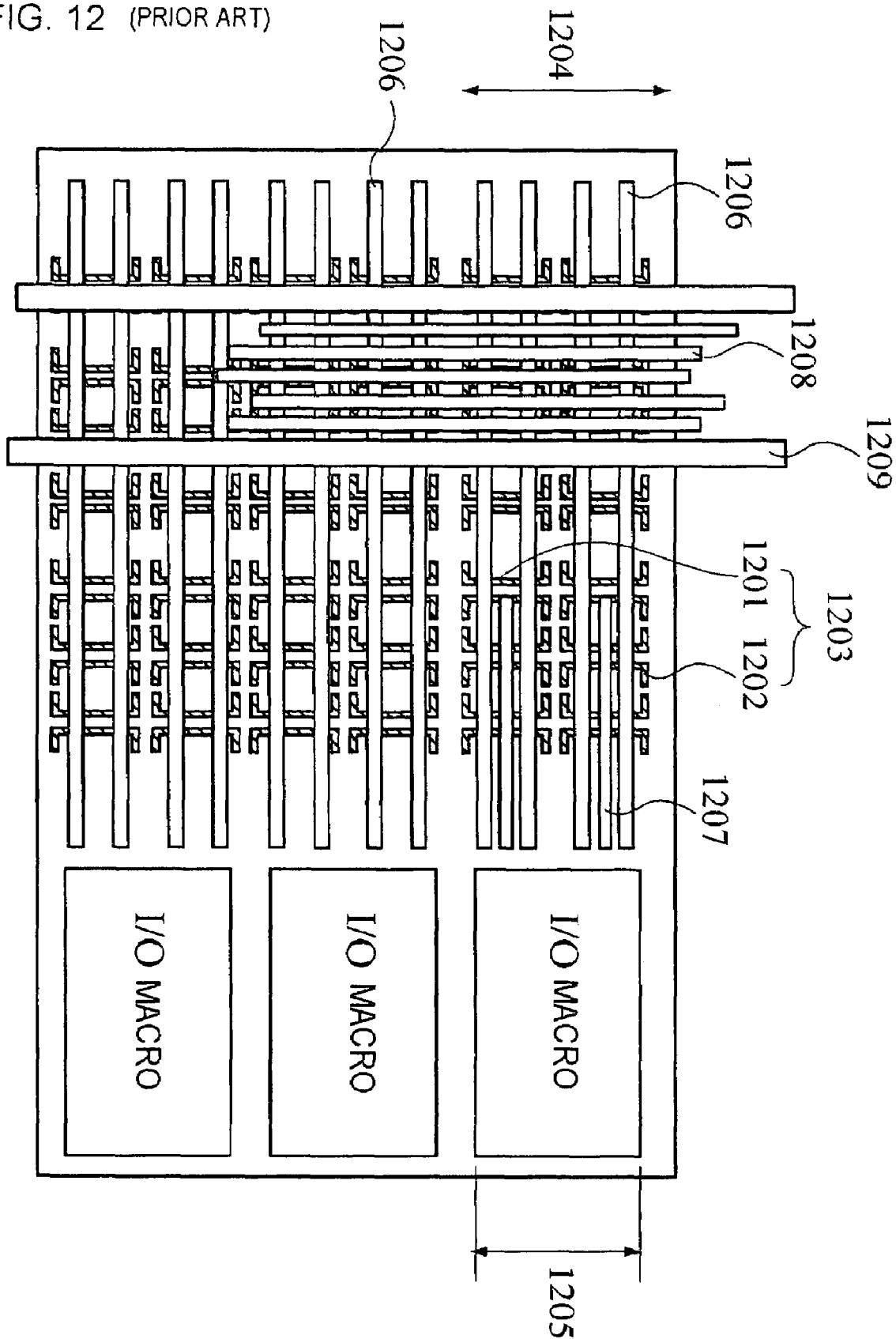
FIG. 12 is an enlarged plan view showing a region 1105 in the primitive block 1102 of the ASIC device shown in FIG. 11.

As already stated referring to FIG. 11, the popular ASIC includes several primitive blocks 1102, 1103, each of which has a distinctive feature that is unique thereto. According to the feature of the respective blocks, various cell heights (1204 in FIG. 12) are provided. The primitive blocks can be broadly classified in to a multifunctional logic block and a high-performance logic block.

In the multifunctional logic block, the cell height is usually less than a spacing between the power supply lines, which encourages the use of the interconnects that provide a connection between the cells. In this case, accordingly, it is the interconnects serving to connect the cells that are frequently used, and such interconnects are disposed orthogonal to the cell height direction.

In contrast in the high-performance logic block, a large driving capability is required from most of the cells, and hence the cell height is often made higher. Accordingly, the cell height is often greater than the spacing between the power supply lines, and the frequently used interconnect is disposed parallel to the cell height direction.

The longitudinal direction of the frequently used interconnect is called as a direction of the dominant length of the interconnect, and is determined based on the layout of the primitive cells.

Based on the findings thus far achieved, the present inventors have designed a semiconductor device, such that the direction of the dominant length of the interconnect is aligned with the scanning direction of the exposure equipment, so as to enlarge the process window.

Hereunder, a first embodiment of the present invention will be described referring to the associated drawings.

Figure 3:
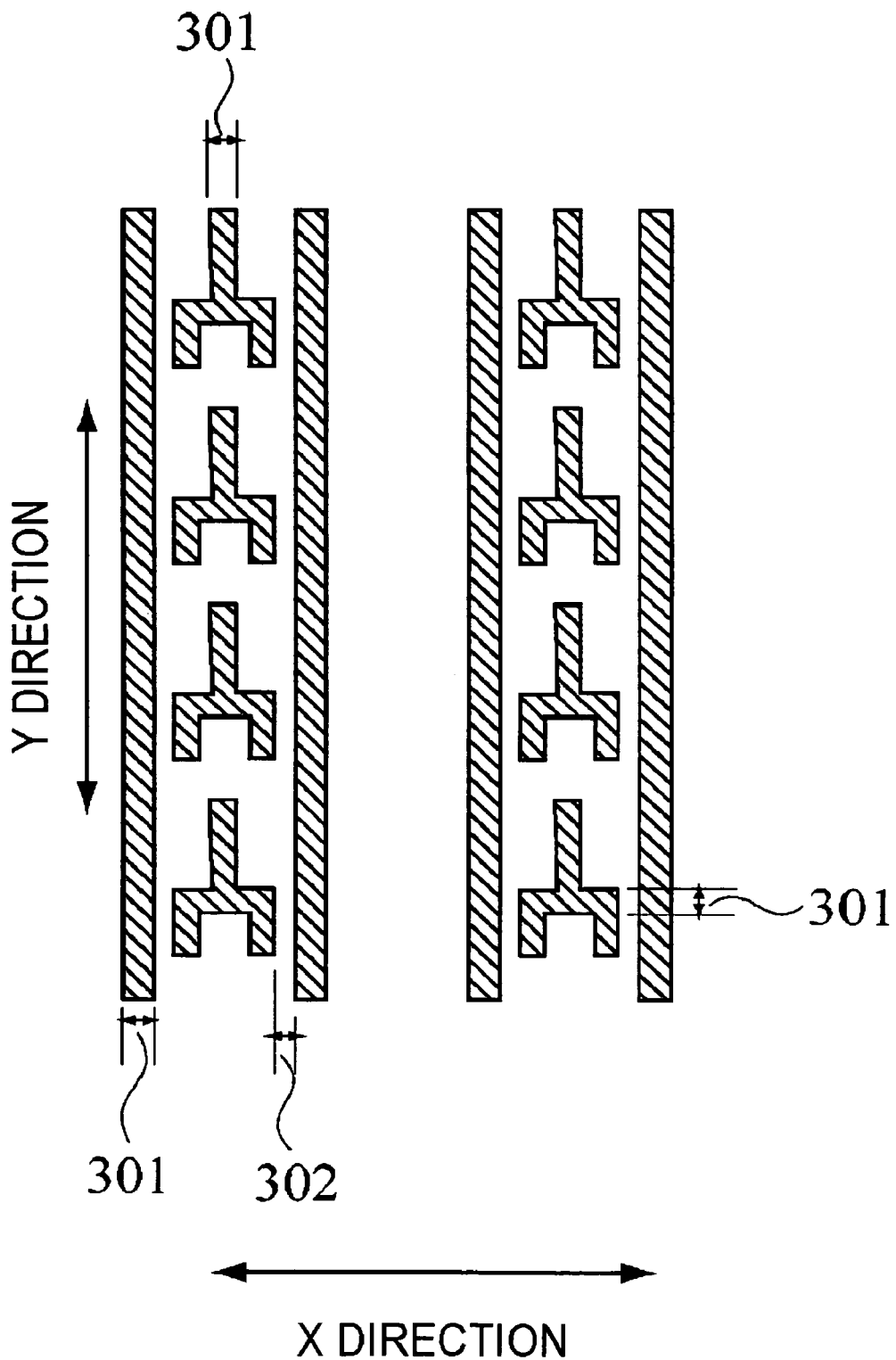
FIG. 3 is an enlarged schematic drawing showing a part of an interconnect layer M1 of a multifunctional logic block of a semiconductor device according to a first embodiment of the present invention.

FIG. 3 is an enlarged schematic drawing showing a part of an interconnect layer M1 of a multifunctional logic block of a semiconductor device according to the first embodiment of the present invention. A minimum interconnect width 301 and a minimum spacing between interconnects 302 are 90 nm, both in X direction and Y direction. In the case where the finished semiconductor device is to include rectangular chips (dies), the scanning direction for the wafer stage of the exposure equipment to be employed for fabricating the semiconductor device is normally parallel to the longitudinal sides of the chips. And such scanning direction corresponds to the Y direction in FIG. 3.

Such high-density primitive cells have a lower height than the spacing among the power supply mesh. When cell height is lower than the spacing of the power supply mesh, it is preferable to dispose the cell height direction aligned with the X direction in FIG. 3. This direction is orthogonal to an extension of the interconnect that connects the cells. Such arrangement sets the direction of the dominant length of the interconnect aligned with the Y direction, so that the scanning is performed in the Y direction.

Figure 4:
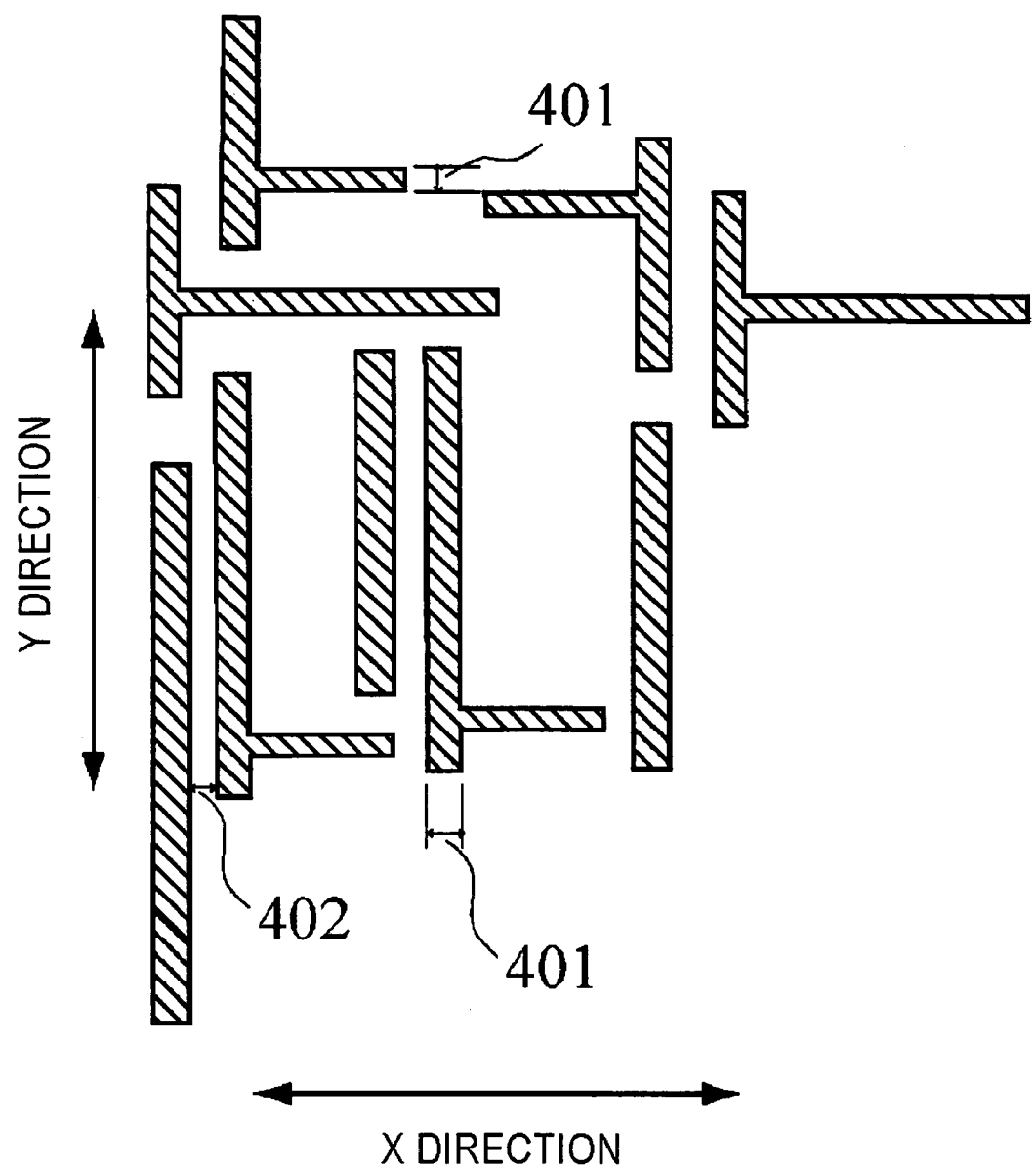
FIG. 4 is an enlarged schematic drawing showing a part of the interconnect layer M1 of a high-performance logic block of the semiconductor device according to the first embodiment of the present invention.

FIG. 4 is an enlarged schematic drawing showing a part of the interconnect layer M1 of a high-performance logic block of the semiconductor device according to the first embodiment of the present invention. A minimum interconnect width 401 and a minimum spacing between interconnects 402 are 90 nm, both in X direction and Y direction as in FIG. 3. In FIG. 4 also, the scanning direction for the wafer stage is the Y direction.

In the high-performance logic block, the cell height is usually higher than a spacing among the power supply mesh. In such a case, it is preferable to dispose the cell height direction aligned with the Y direction in FIG. 4. Such arrangement sets the direction of the dominant length of the interconnect aligned with the Y direction as well, so that the scanning is performed in the Y direction.

Now, the ASIC working as the semiconductor device includes an I/O unit that exchanges signals with an external device, and a logic unit that processes the signals, and the logic unit includes two or more logic blocks in which a plurality of basic cells constituted of a pair of a P-MOS transistor and an N-MOS transistor is regularly aligned, such that the basic cells are of a uniform size in the respective logic blocks. In the ASIC device, thus constituted of the plurality of logic blocks, it is preferable to review a relation between the cell height and the spacing among the power supply mesh of each block, to thereby determine the layout of the cells.

More specifically, a designed height of the primitive cell constituted of the P-MOS transistor and N-MOS transistor is compared with the spacing among the power supply mesh in the interconnect layer M2. If the primitive cell has a higher designed height than the spacing among the power supply mesh, that primitive cell is disposed such that the height direction is aligned with the scanning direction for the wafer stage of the exposure equipment. In contrast, those primitive cells that have a lower designed height than the spacing among the power supply mesh are disposed such that the height direction becomes orthogonal to the scanning direction. The semiconductor device which was manufactured with such a design method enables disposing the direction of the dominant length of the interconnects in the same orientation, so that performing the scanning in such direction allows expanding the process margin. Since generally the defect rate largely depends on frequency of use of the interconnect, and therefore upgrading the processing accuracy of the interconnect can effectively improve the yield.

In this embodiment, the interconnect layer M1 includes the narrowest interconnect and narrowest spacing between interconnects, among the plurality of interconnect layers connecting the basic cells in the respective logic blocks. Since, in such interconnect layer M1, the longitudinal direction of the frequently used interconnect is aligned with the scanning direction for the wafer stage of the exposure equipment, the processing accuracy and the yield can be effectively improved. Here, it is not imperative that the interconnect layer M1 includes the minimum value in both of the interconnect width and the spacing between interconnects. Though only either of the interconnect width or the spacing between interconnects is the minimum, setting the frequently used interconnect aligned with the scanning direction in the interconnect layer M1 can effectively improve the processing accuracy.

Further in this embodiment, in the logic block in which a diffusion layer for the P-MOS transistor or the N-MOS transistor constituting the basic cells is shorter than a spacing between power supply lines or between reference potential interconnects in the second interconnect layer provided on the first interconnect layer via an insulating layer, the longitudinal direction of the frequently used interconnect is aligned with the longitudinal direction of the diffusion layer for the transistors. Such structure allows connecting the power supply lines or reference potential interconnects in the interconnect layer M2 and the diffusion layer via the frequently used interconnect in the interconnect layer M1, though direct connection via a contact plug or the like cannot be achieved. Here, the frequently used interconnect in the interconnect layer M1 may be disposed such that the longitudinal direction is aligned with the longitudinal direction of the diffusion layer for the transistors, depending on the layout of the interconnects.

Figure 5:
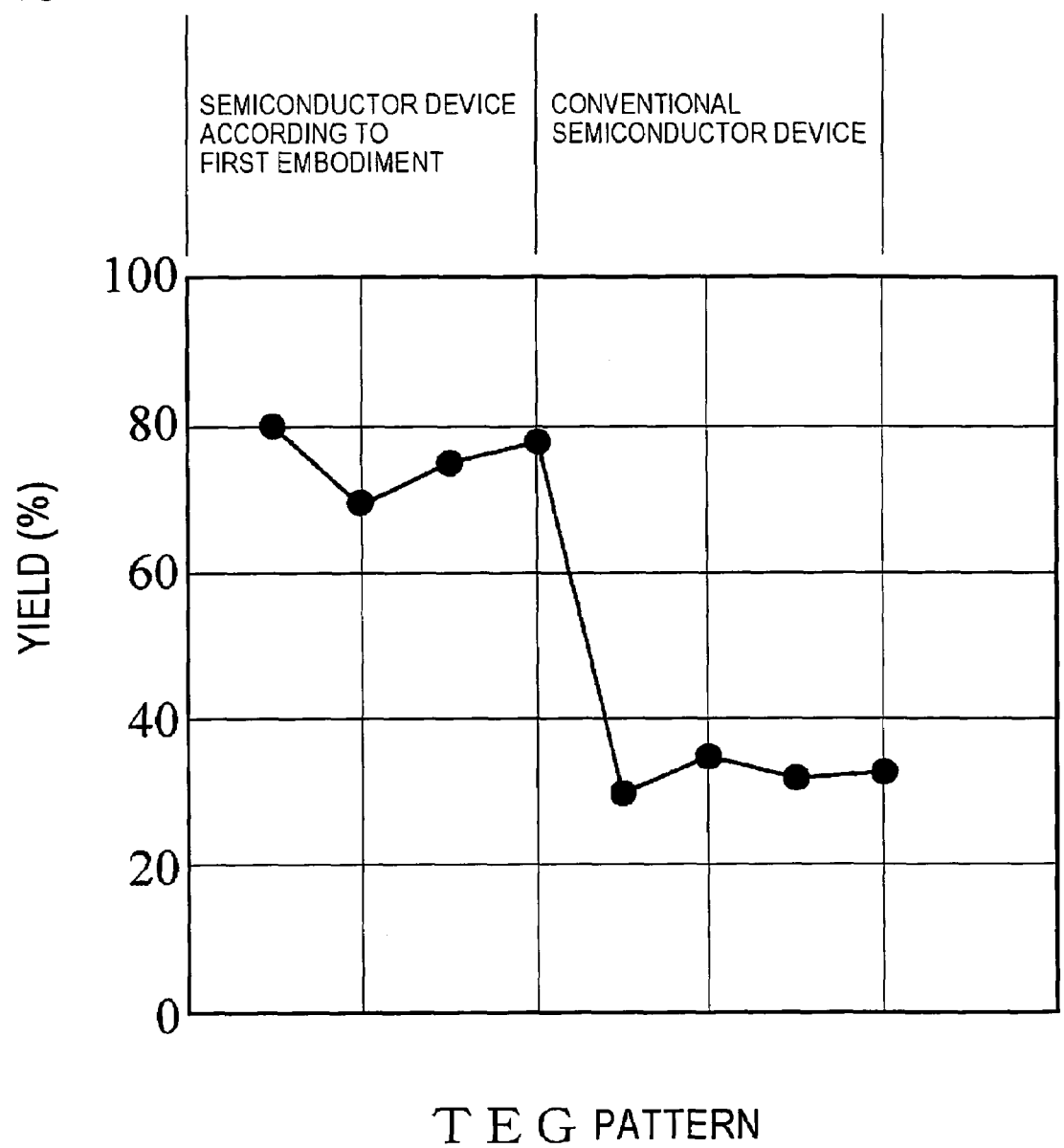
FIG. 5 is a line graph for comparison of defect rates between TEGs of the semiconductor device according to the first embodiment of the present invention and a conventional semiconductor device.

FIG. 5 is a line graph for comparison of defect rates between TEGs (Test Element Groups) of the semiconductor device according to the first embodiment of the present invention. The graph proves that the yield, which used to be 30 to 35%, has been improved up to 70 to 80%.

The following passages describe a second embodiment of the present invention, referring to the associated drawings.

Figure 6:
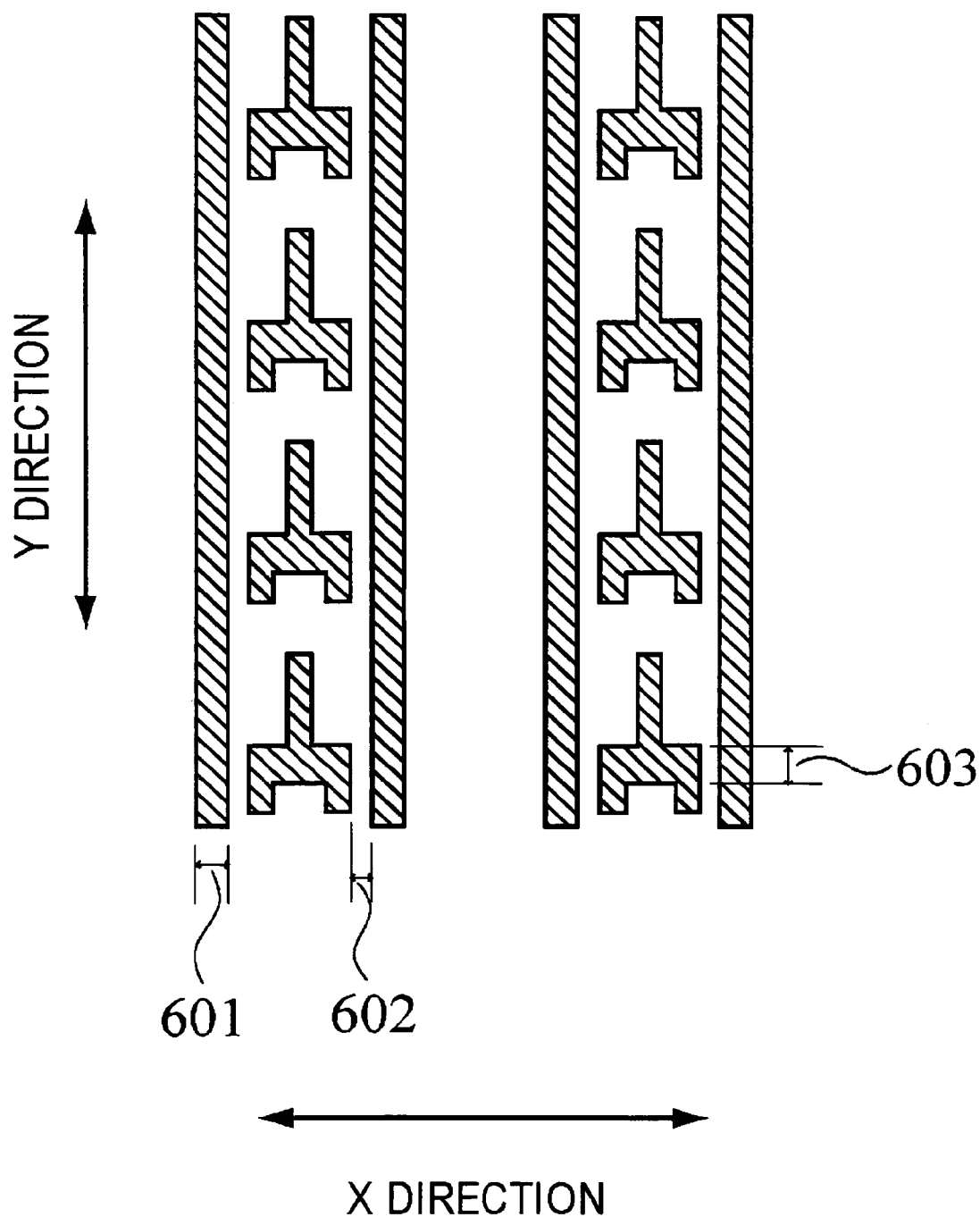
FIG. 6 is an enlarged schematic drawing showing a part of an interconnect layer M1 of a multifunctional logic block of a semiconductor device according to a second embodiment of the present invention.
Figure 7:
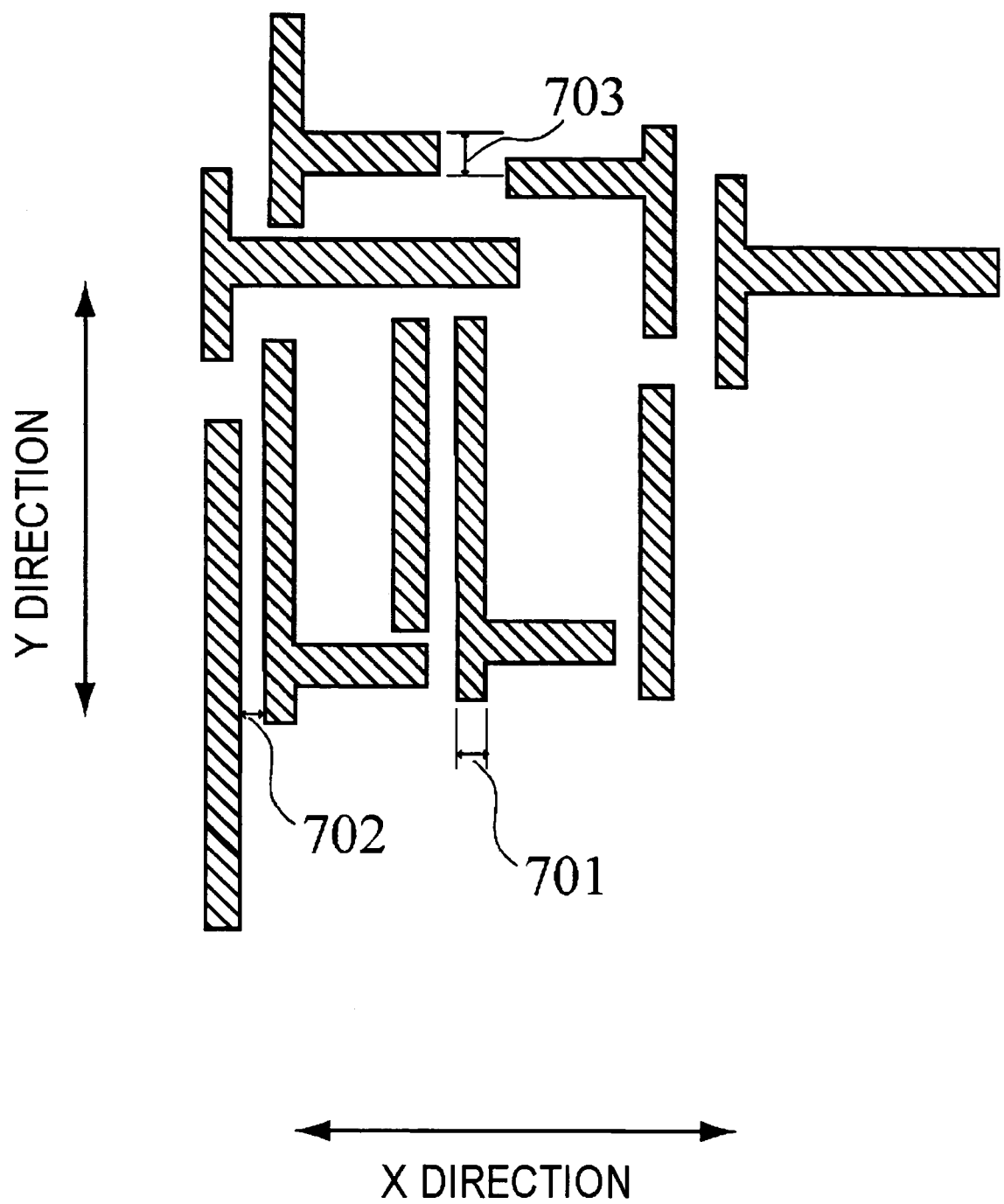
FIG. 7 is an enlarged schematic drawing showing a part of the interconnect layer M1 of a high-performance logic block of the semiconductor device according to the second embodiment of the present invention.

FIG. 6 is an enlarged schematic drawing showing a part of an interconnect layer M1 of a multifunctional logic block of a semiconductor device according to a second embodiment of the present invention, and FIG. 7 is an enlarged schematic drawing showing a part of the interconnect layer M1 of a high-performance logic block of the semiconductor device according to the second embodiment of the present invention. In both FIGS. 6 and 7, the layout of the cells is similar to FIGS. 3 and 4. In FIGS. 6 and 7 also, the scanning direction for the wafer stage is the Y direction. In addition, a minimum interconnect width 601, 701 in the Y direction and a minimum spacing between interconnects 602, 702 are 90 nm, as in FIGS. 3 and 4. On the other hand, a minimum width 603, 703 of the interconnects in the X direction is set at 120 nm, which is wider than in the Y direction. In the interconnect layer M1, accordingly, the interconnect width or spacing between the interconnects orthogonal to the frequently used interconnect is set wider than the width of the frequently used interconnect, or the spacing therebetween.

Increasing thus the width of the interconnect disposed orthogonal to the scanning direction can further expand the process margin.

Figure 8:
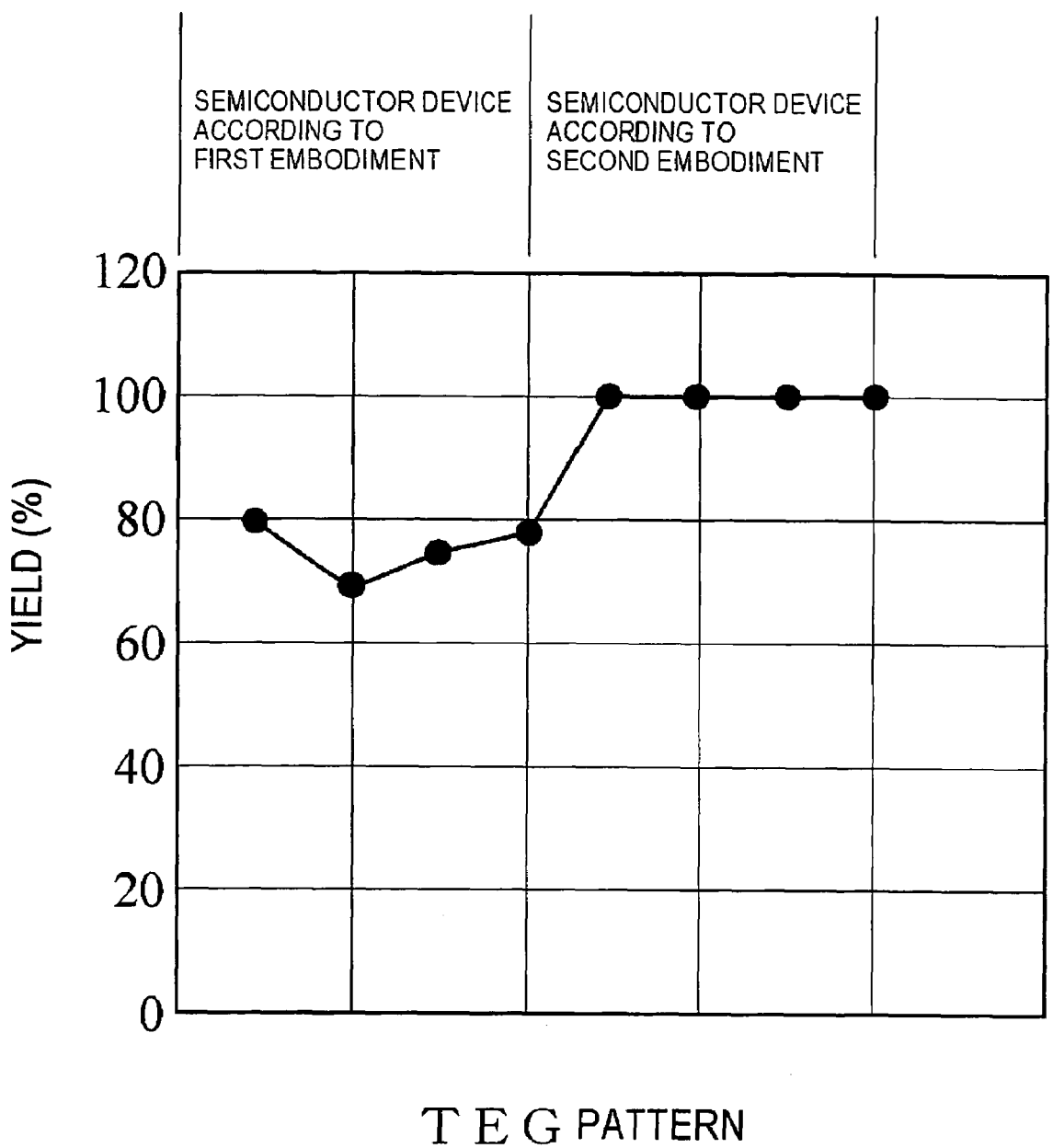
FIG. 8 is a line graph for comparison of defect rates between TEGs of the semiconductor device according to the first embodiment and that of the second embodiment of the present invention.

FIG. 8 is a line graph for comparison of defect rates between TEGs of the semiconductor device according to the first embodiment and that of the second embodiment of the present invention. The graph proves that the yield, which has turned out to be 70 to 80% in the first embodiment, has been improved up to 100% in the second embodiment. Consequently, reviewing the process margin of the interconnect disposed orthogonal to the scanning direction leads to minimizing the defect originating from a pattern collapse.

Figure 9:
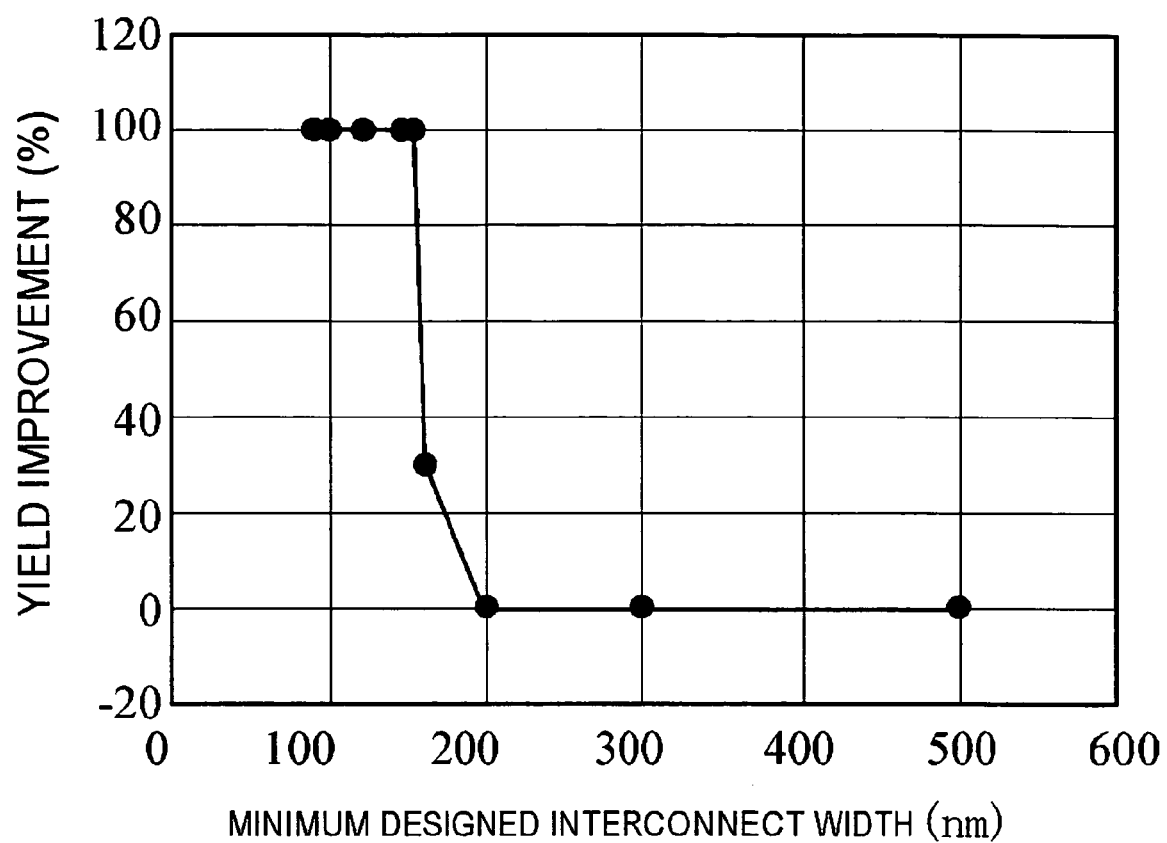
FIG. 9 is a line graph showing a correlation between a narrowest designed width of interconnects and improvement in the yield of the semiconductor device according to the embodiments of the present invention.

FIG. 9 is a line graph showing a correlation between a narrowest designed width of interconnects and improvement in the yield of the semiconductor device according to the embodiments of the present invention. As is apparent from FIG. 9, the improved effect is prominently seen when the minimum designed width is 0.15 μm or less. Presumably, when the sensitivity of the foregoing MEEF value and the designed size enters this range, a significant effect is achieved. In other words, the yield is significantly improved when the minimum width of the frequently used interconnect is 0.15 μm or less, and when the minimum spacing between the frequently used interconnects is 0.15 μm or less.

FIG. 10 includes schematic drawings showing a relation between the wafer on which the semiconductor device is provided and a scanning direction. On the wafer 1001, a plurality of semiconductor devices 1002 is regularly disposed in the X and Y directions. The semiconductor devices 1002 include several metal interconnect layers stacked via an insulating layer. In the interconnect layer M1 1003 including the narrowest interconnects and the narrowest spacing between the interconnects, generally, the longitudinal direction of the frequently used interconnect is aligned in a single direction, which is the Y direction, i.e. the scanning direction. The wafer is provided with a marking for fabrication called an orientation flat 1004 or a cutaway portion 1005, which can be utilized for setting the scanning direction to be orthogonal to a tangential line of the portion of the circumference where such marking is provided.

The embodiments of the present invention have been described in details referring to the associated drawings, however it is to be understood that the present invention is not limited to these specific embodiments.

The specific shape, size, layout or material of the elements constituting the semiconductor device, the size of the wafer, the process required for the fabrication and so forth may be substituted with those appropriately designed by persons skilled in the art, without limitation to those referred to in the foregoing embodiments of the present invention. To cite a few examples, the chip formed on the semiconductor substrate is not limited to a transistor, and the similar advantageous effect can be achieved as long as, in the interconnect layer that includes the narrowest interconnect or narrowest spacing between the interconnects among the plurality of interconnect layers provided on the chip via the insulating layer, a longitudinal direction of the frequently used interconnect is aligned with the scanning direction for the wafer stage of the exposure equipment to be employed for fabricating the semiconductor device.

The present invention also includes a method of designing a semiconductor device including a plurality of circuit blocks in which a plurality of P-MOS transistors and N-MOS transistors are alternately disposed, comprising, in a first interconnect layer that includes a narrowest interconnect or a narrowest spacing between interconnects among interconnect layers connecting the P-MOS transistors and N-MOS transistors in at least one of the circuit blocks, setting a longitudinal direction of a frequently used interconnect to be aligned with a scanning direction for a wafer stage of an exposure equipment to be employed for fabricating the semiconductor device.

Further, the present invention includes a method of manufacturing a semiconductor device including a plurality of circuit blocks in which a plurality of P-MOS transistors and N-MOS transistors are alternately disposed, comprising, in a first interconnect layer that includes a narrowest interconnect or a narrowest spacing between interconnects among interconnect layers connecting the P-MOS transistors and N-MOS transistors in at least one of the circuit blocks, setting a longitudinal direction of a frequently used interconnect to be aligned with a scanning direction for a wafer stage of an exposure equipment to be employed for fabricating the semiconductor device.

Furthermore, all semiconductor devices and wafers, as well as methods of manufacturing the semiconductor device that include the constituents according to the present invention, including those optionally modified by persons skilled in the art, are duly included in the scope of the present invention.

It is apparent that the present invention is not limited to the above embodiment, that may be modified and changed without departing from the scope and spirit of the invention.

What is claimed is:

1. A semiconductor device, comprising:
   two or more logic blocks in which a plurality of basic cells constituted of a pair of a P-MOS transistor and an N-MOS transistor is regularly aligned such that said basic cells are of a uniform size in the respective logic blocks,
   wherein a first interconnect layer includes a narrowest interconnect or a narrowest spacing between interconnects among said plurality of interconnect layers connecting said basic cells in at least one of said logic blocks, and,
   wherein, in said logic block in which a cell height of said basic cells is shorter than a spacing between power supply lines in a second interconnect layer provided on said first interconnect layer via an insulating layer, a longitudinal direction of said frequently used interconnect in said first interconnect layer is orthogonal to the cell height direction.

2. The semiconductor device according to claim 1, wherein a width of said interconnect or a spacing between said interconnects orthogonal to said frequently used interconnect in said first interconnect layer is wider than a width of said frequently used interconnect or a spacing between said frequently used interconnects.

3. The semiconductor device according to claim 1, wherein a minimum width of said frequently used interconnect is not wider than 0.15 µm, and a minimum spacing between said frequently used interconnects is not wider than 0.15 µm.

4. The semiconductor device according to claim 1, wherein said minimum spacing between said frequently used interconnects is not more than 0.3 µm.

5. A semiconductor device, comprising:
   two or more logic blocks in which a plurality of basic cells constituted of a pair of a P-MOS transistor and an N-MOS transistor is regularly aligned such that said basic cells are of a uniform size in the respective logic blocks,
   wherein a first interconnect layer includes a narrowest interconnect or a narrowest spacing between interconnects among said plurality of interconnect layers connecting said basic cells in at least one of said logic blocks, and,
   wherein, in said logic block in which a cell height of said basic cells is longer than said spacing between power supply lines in said second interconnect layer provided on said first interconnect layer via said insulating layer, a longitudinal direction of said frequently used interconnect in said first interconnect layer is parallel to the cell height direction.

6. The semiconductor device according to claim 5, wherein a width of said interconnect or a spacing between said interconnects orthogonal to said frequently used interconnect in said first interconnect layer is wider than a width of said frequently used interconnect or a spacing between said frequently used interconnects.

7. The semiconductor device according to claim 5, wherein a minimum width of said frequently used interconnect is not wider than 0.15 µm, and a minimum spacing between said frequently used interconnects is not wider than 0.15 µm.

8. The semiconductor device according to claim 5, wherein said minimum spacing between said frequently used interconnects is not more than 0.3 µm.

* * * * *